United States Patent [19]

Steup

[11] Patent Number: 4,653,783
[45] Date of Patent: Mar. 31, 1987

[54] DEVICE FOR DETACHABLY SECURING A HOUSING PART

[75] Inventor: Walter Steup, Krefeld, Fed. Rep. of Germany

[73] Assignee: U.S. Philips Corporation, New York, N.Y.

[21] Appl. No.: 757,997

[22] Filed: Jul. 23, 1985

[30] Foreign Application Priority Data

Jul. 28, 1984 [DE] Fed. Rep. of Germany ....... 3427936

[51] Int. Cl.[4] ............................................. E05C 19/06
[52] U.S. Cl. ................................ 292/19; 292/DIG. 61
[58] Field of Search ...................... 292/17, 19, 20, 80, 292/87, 88, 89, 121, 128, DIG. 61

[56] References Cited

U.S. PATENT DOCUMENTS

| 1,094,279 | 4/1914 | Wagner | 292/19 X |
| 2,113,687 | 4/1938 | Grace | 292/80 |
| 2,588,230 | 3/1952 | George | 70/363 |
| 3,556,572 | 1/1971 | Olsson | 292/128 X |
| 3,971,237 | 7/1976 | Rasmussen | 292/87 X |

FOREIGN PATENT DOCUMENTS

| 717309 | 2/1942 | Fed. Rep. of Germany | 292/19 |
| 1971090 | 3/1967 | Fed. Rep. of Germany | . |
| 1810231 | 6/1970 | Fed. Rep. of Germany | 292/19 |
| 7321287 | 6/1973 | Fed. Rep. of Germany | . |

Primary Examiner—Richard E. Moore
Attorney, Agent, or Firm—David R. Treacy

[57] ABSTRACT

A housing part is engageable with a side wall of a housing, and latched to the housing by at least two latching noses on the housing part near another side wall of the housing. At least two latching springs engage with latching noses on the housing part. Each latching spring is additionally biased into engagement with the latching nose by a rubber buffer which is inserted into a space between the spring and the outer housing wall, this rubber buffer being formed as part of a housing foot.

7 Claims, 2 Drawing Figures

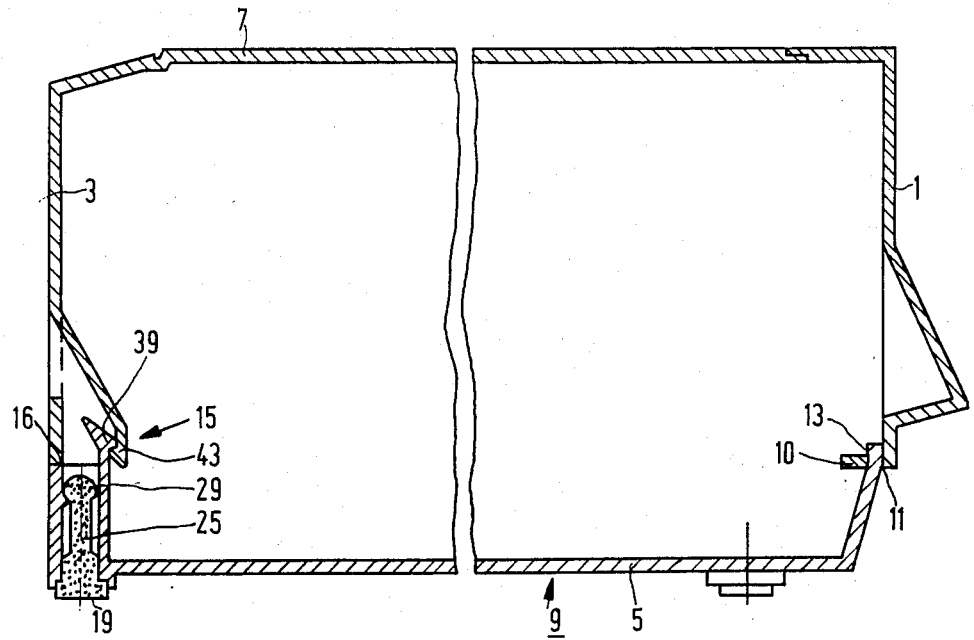
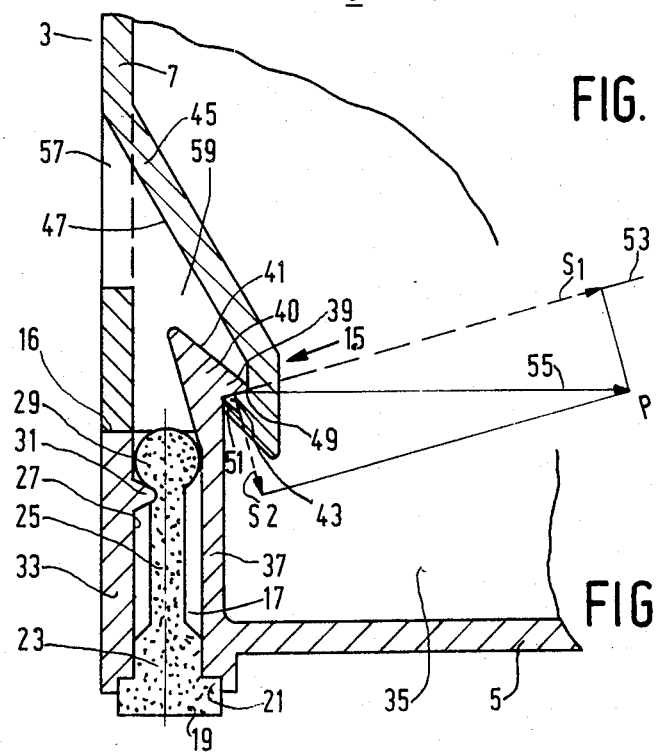
FIG. 1
FIG. 2

4,653,783

DEVICE FOR DETACHABLY SECURING A HOUSING PART

BACKGROUND OF THE INVENTION

The invention relates to a device or latching arrangement for securing a housing part detachably and without screws to a housing of an electrical apparatus, and particularly to such a housing part which closes the housing. The part is engageable with a side wall of the housing and is latched to the housing by means of at least two latching noses, near a wall opposite the housing side wall. The housing is provided with latching springs which engage behind the latching noses of the detachable housing part, at at least two locations.

In order to simplify the assembly of electrical apparatuses, the customary screw connections are being replaced more and more by what is referred to as snap connections. From German Gebrauchsmuster No. 73 21 287 it is known to mount the rear wall of a radio or television apparatus by means of such a snap technique. For this purpose the rear wall engages with the housing along an edge of a side wall, about which it is tilted, and is snapped onto the housing with the edge of an opposite side wall. The snap connection comprises a latching spring and a latching nose on the rear wall. As soon as the latching spring has snapped behind the latching nose, the rear wall can no longer be tilted away or swung down. In accordance with a statutory regulation, unlatching should be effected only by means of a tool, for example a screw-driver, to prize the latching means apart.

If a plastic housing should be manufactured economically, this means that a cheap plastic, for example polystyrol, has to be used. However, polystyrol has the disadvantage that it suffers from fatigue and ageing. Since the latching spring is constantly under pretension, the tensioning or latching force diminishes as a result of ageing. Therefore, when a cheap plastic is used, the known construction is not sufficiently reliable because its latching force deteriorates in the long run.

In general, electric apparatus such as video recorders are provided with rubber feet for resiliently supporting these apparatuses relative to the surface on which they are placed. These rubber feet are drawn into recesses by means of a tool. In accordance with another fastening method described in German Gebrauchsmuster No. 19 71 090 the rubber foot is provided with an injection-molded plastic part, which in its turn is snapped into the housing.

SUMMARY OF THE INVENTION

It is the object of the invention to provide a latching arrangement of the type specified in the opening paragraph, in which the tensioning or latching force does not deteriorate during the life of the apparatus when a cheap plastic is used for the latching spring.

According to the invention this object is achieved in that a rubber buffer is arranged behind each latching spring in the direction of withdrawal. This buffer bears against the housing and urges the latching spring constantly into the latched position. The buffer may be made of an elastomeric material, whose elasticity does not degrade during the life of the apparatus.

Preferably, the latching point is situated near the bottom of the apparatus, and the elastomer buffer forms part of an elastomer foot which has an extension near the latching point. Thus, the buffer need not be a part which is to be mounted separately; it can be mounted as a foot and at the same time constitutes the buffer.

In the preferred embodiment the portion of the extended elastomer foot which is widened to form the buffer is supported by a projection which reduces the cross-section of the recess into which the elastomer foot is inserted, the buffer being clamped and acting between the rigid outer wall of the recess constituted by the plastic housing and the resilient latching spring formed by the plastic material of the housing. The buffer then performs two functions. It functions as a resilient support for the latching spring and it retains the rubber foot in the recess because the projection ensures that it cannot slip out. This double function greatly simplifies the construction and mounting.

In the preferred embodiment each latching spring comprises a further latching nose which engages with the latching nose formed on an elastic limb of the housing part to be mounted. Between the latching nose and the limb carrying the latching nose a gap is formed which widens from the latching point. A lever tool can be inserted into this gap through an opening in the housing part to be fastened. The use of a wedge-shaped gap is advantageous in order to enable the leverage of a screw-driver which is twisted inside the gap to be employed for opening or unlatching.

Finally, in accordance with another embodiment of the invention, the contact surfaces of the latching nose and the further latching nose extend in a plane which makes an acute angle of 10° to 40° with the direction in which the latching force acts. This provides an effective latching and an easy detachability by means of a screw-driver.

An embodiment of the invention will be described in more detail, by way of example, with reference to the accompanying drawing.

BRIEF DESCRIPTION OF THE DRAWING

FIG. 1 is a sectional view of the housing of a video recorder, comprising a bottom section and a cover which is snapped onto the bottom section, and FIG. 2 is an enlarged-scale sectional view of the snap connection comprising a rubber buffer, as shown in FIG. 1.

DESCRIPTION OF THE PREFERRED EMBODIMENT

FIG. 1 is a sectional view of an empty video-recorder housing, taken from the front 1 to the rear 3. The video-recorder housing comprises a bottom section 5 and a cover 7. The bottom section 5 should be regarded as an open housing 9, which is closed by means of another housing section, namely the cover 7. The invention may also be utilized if the open housing section 9 comprises the bottom of the cover and is closed by a housing part constituted by the rear wall. Such a construction functions in the same way.

At the front 1 of the apparatus near an edge 10 a portion of the cover is engagable in a hole 11 in the bottom section 5. The resulting connection 13 functions as a hinge, so that the cover can be snapped in the snap connection 15 situated near a cover edge 16 at the rear 3. Two or more recesses 17 are formed in the bottom section 5, spaced equidistantly along the rear 3, into which recesses the rubber feet 19 can be inserted. Each rubber foot 19 is situated inside a groove 21. The foot portion 23 comprises an extension 25 of smaller cross-section, which is clear of the wall 27 of the recess 17. The upper end of the extension 25 carries a widened knob-like portion which constitutes a rubber buffer 29. This buffer 29 lies against a projection 31, which locally reduces the cross-section of the recess 17.

The wall 33 of the injection-molded plastic bottom section 5 at the rear 3 is rigid and immovable. The wall bounding the recess towards the interior 35 of the apparatus is constructed as a latching spring 37 and is elastic. Above the buffer 29 the latching spring 37 comprises a latching nose 39 and an extension 40 with an upwardly inclined bounding surface 41.

The latching nose 39 cooperates with a latching nose 43 which is integral with a limb 45. The limb 45 forms part of the cover 7 and extends obliquely downwards with a lower surface 47. The lower surface 47 and the bounding surface 41 enclose a wedge-shaped space which diverges from the latching point 49.

In the latched position as shown in FIGS. 1 and 2 the latching nose 39 and the latching nose 43 have cooperating contact surfaces 51. These contact surfaces 51 extend in a plane 53 which makes an acute angle of approximately 10° to 40° with the direction 55 of the latching force. The latching force P can be resolved into mutually perpendicular components $S_1$ and $S_2$, which extend in the same direction as and perpendicularly to the contact surfaces 51.

If the bottom section 5 is made of a lower-grade plastic, for example polystyrol, the inherent resilience of the spring 37 will diminish in the course of time. This effect is counteracted by means of the buffer 29, which is clamped between the outer wall 33 and the spring 37. The buffer 29 exerts a constant force on the spring 37. When a suitable elastomer is used this constant force will not diminish, and on account of the buffer the spring characteristic of the spring 37 is progressive under pressure. The two spring characteristics, that of the plastic material and that of the elastomer, are superimposed to give an effective characteristic which guarantees a lasting and reliable snap connection, because the latching forces remain constant. These latching forces can be influenced to a substantial extent by the shape and the elasticity of the buffer.

The foot can be mounted easily because the latching spring 37 can be pressed away when this foot is inserted. The insertion space, the recess 17, is thus widened during insertion.

Below the limb 45 the cover 7 has an opening 57. Through this opening 57 a tool, for example a screwdriver, can be inserted into the wedge-shaped gap 59 between the limb 45 and latching nose 39. By turning the screwdriver inside the gap 59 the two noses are disengaged from each other and the snap connection 15 is released. When the cover 7 is pressed home again, the latching nose 39 and the latching nose 43 engage with each other and the cover 7 is secured so firmly that it cannot be detached without the use of a tool. In this way the requirement that opening should be possible only by means of a tool is met and the buffer ensures that a sufficiently reliable snap connection is obtained for the life of the apparatus.

What is claimed is:

1. A latching arrangement for securing a housing part detachably to a housing, comprising
    a wall connected to said housing,
    at least one latching nose connected to said housing part, having a latching surface disposed with said surface spaced from said wall at a side of the nose toward the wall,
    a latching element connected to said housing, spaced from said wall between the wall and said nose, and arranged for engagement with said nose,
    a spring arranged to bias said element in a latching direction toward and into latching engagement with said nose, and
    an elastomer foot arranged to protrude from a bottom surface of said housing,
    characterized in that an elastic buffer is disposed between said spring and said wall, to bias said spring constantly in the latching direction,
    said latching nose and said element are disposed at a latching point near said bottom surface, and
    said foot has an extension near said latching point, said buffer forming part of said extension.

2. An arrangement as claimed in claim 1, characterized in that said element comprises a further latching nose, said element and said spring being formed as a one piece unitary part of said housing.

3. An arrangement as claimed in claim 2, characterized in that said latching nose connected to the housing part is arranged at the end of a limb, and
    in the snap-in condition a wedge-shaped gap is formed diverging from the latching point toward an opening to permit insertion of a tool into the gap between said further nose and said limb.

4. An arrangement as claimed in claim 3, characterized in that said latching surface of said nose and a contact surface on said further latching nose extend in a plane making an acute angle between 10° and 40° to the direction in which the latching force acts.

5. An arrangement as claimed in claim 4, characterized in that said extension of said foot has a portion which is widened to form the buffer, and
    said wall connected to said housing has a projection extending inwardly to reduce the cross-section of the space between the wall and the spring, so as to clamp the buffer between the spring and the projection and thereby hold the inserted foot in place.

6. An arrangement as claimed in claim 2, characterized in that said latching surface of said nose and a contact surface on said further latching nose extend in a plane making an acute angle between 10° and 40° to the direction in which the latching force acts.

7. An arrangement as claimed in claim 1, characterized in that said extension of said foot has a portion which is widened to form the buffer, and
    said wall connected to said housing has a projection extending inwardly to reduce the cross-section of the space between the wall and the spring, so as to clamp the buffer between the spring and the projection and thereby hold the inserted foot in place.

* * * * *